United States Patent
Bonen (10) Patent No.: US 10,715,346 B1
(45) Date of Patent: *Jul. 14, 2020

(54) DYNAMICALLY ADJUSTING DOCSIS PORT UTILIZATION

(71) Applicant: Harmonic, Inc., San Jose, CA (US)

(72) Inventor: Adi Bonen, Belle Mead, NJ (US)

(73) Assignee: Harmonic, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/847,029

(22) Filed: Dec. 19, 2017

Related U.S. Application Data (60) Provisional application No. 62/436,381, filed on Dec. 19, 2016.

(51) Int. Cl.
*H04L 12/28* (2006.01)
*H04L 12/935* (2013.01)
*H04L 12/803* (2013.01)

(52) U.S. Cl.
CPC ........ *H04L 12/2801* (2013.01); *H04L 47/125* (2013.01); *H04L 49/30* (2013.01)

(58) Field of Classification Search
CPC .... H04L 12/2801; H04L 47/125; H04L 49/30
See application file for complete search history.

(56) References Cited

U.S. PATENT DOCUMENTS

| | | | |
|---|---|---|---|
| 7,773,594 B2 * | 8/2010 | Asati | H04L 12/2801 370/389 |
| 2003/0093799 A1 * | 5/2003 | Kauffman | H04L 29/06 725/86 |
| 2005/0058082 A1 * | 3/2005 | Moran, III | H04L 1/0003 370/252 |
| 2006/0251097 A1 * | 11/2006 | Chapman | H04L 12/2801 370/431 |
| 2009/0007199 A1 * | 1/2009 | La Joie | H04L 12/2801 725/95 |
| 2012/0054312 A1 * | 3/2012 | Salinger | H04L 65/1089 709/219 |
| 2013/0088961 A1 * | 4/2013 | Ramachandran | H04L 47/125 370/235 |

(Continued)

*Primary Examiner* — Benjamin R Bruckart
*Assistant Examiner* — Aklil M Tesfaye
(74) *Attorney, Agent, or Firm* — Christopher J. Brokaw; Brokaw Patent Law PC (57) ABSTRACT

Dynamically adjusting upstream and/or downstream spectrum usage by a Remote PHY node. Cable modem association information for a Remote PHY node is dynamically determined remotely from across a network. The association information identifies which cable modems serviced by the Remote PHY node are physically connected to each of the Remote PHY node ports. Remote PHY node ports are remotely and dynamically assigned to upstream device port and/or downstream device port of a Remote PHY device comprised within the Remote PHY node. Based on the association information, each of the node port of the Remote PHY node may be reassigned to a different upstream device ports and/or downstream device ports of the Remote PHY device. This reassignment may be performed to achieve load balancing of upstream and/or downstream traffic sent between a plurality of cable modems served by the Remote PHY node and a Cable Modem Termination System (CMTS).

21 Claims, 5 Drawing Sheets

(56) References Cited

U.S. PATENT DOCUMENTS

| | | | | |
|---|---|---|---|---|
| 2013/0125182 A1* | 5/2013 | Bowler | H04H 60/43 | 725/105 |
| 2013/0322504 A1* | 12/2013 | Asati | H04L 41/0853 | 375/224 |
| 2014/0101711 A1* | 4/2014 | Rakib | H04N 21/6118 | 725/129 |
| 2014/0150041 A1* | 5/2014 | Rakib | H04N 7/10 | 725/111 |
| 2014/0185428 A1* | 7/2014 | Thibeault | H04L 47/12 | 370/225 |
| 2015/0092531 A1* | 4/2015 | Bernstein | H04L 41/0672 | 370/216 |
| 2015/0295838 A1* | 10/2015 | Liu | H04L 5/0007 | 370/235 |
| 2017/0155444 A1* | 6/2017 | Patel | H04B 7/18584 | |
| 2018/0109319 A1* | 4/2018 | Jones | H04B 10/564 | |

* cited by examiner

DYNAMICALLY ADJUSTING DOCSIS PORT UTILIZATION

CLAIM OF PRIORITY AND RELATED APPLICATION DATA

This application claims priority to U.S. Provisional Patent Application Ser. No. 62/436,381, filed Dec. 19, 2016, entitled "CableOS Smart Node ('Ripple')," the contents of which are hereby incorporated by reference for all purposes as if fully set forth herein.

This application is related to U.S. Non-provisional patent application Ser. No. 13/847,099, entitled, "Processing a Signal Originating From a Node Port Experiencing Ingress," invented by Adi Bonen, filed on Dec. 19, 2017, the entire disclosure of which is hereby incorporated by reference for all purposes as if fully set forth herein.

FIELD OF THE INVENTION

Embodiments of the invention relate to dynamically adjusting upstream and/or downstream spectrum usage by a Remote PHY node.

BACKGROUND

A Converged Cable Access Platform (CCAP) is an industry standard platform for transmitting video data and voice content. CCAP is led by CableLabs® of Sunnyvale, Calif. CCAP unifies the Converged Multiservice Access Platform (CMAP), managed by Comcast Corporation of Philadelphia, Pa., with the Converged Edge Services Access Router platform (CESAR), which is managed by Time Warner Cable, Inc. of New York, N.Y.

A virtual Converged Cable Access Platform (CCAP) is software that performs the functions of a hardware-based CCAP. The virtual CCAP may execute on hardware components that include a commercial off-the-shelf switch/router and one or more off-the-shelf computing servers. A commercial example of a virtual CCAP is CableOS™, available from Harmonic, Inc. of San Jose, Calif.

CableLabs has publicly issued a Remote PHY family of specifications known as the MHAv2 specifications (Modular Headend Architecture version 2). These specifications describe how a CCAP platform may be separated into two components, (1) a CCAP Core located at a cable headend, and (2) a Remote PHY node (RPN), which is typically located outdoors.

The CCAP Core may transmit multiple downstream channels to a plurality of RPNs. Each RPN, in turn, may transmit those downstream channels to a plurality of cable modems. A cable modem will typically have less channel capacity than the CCAP Core. For example, a particular cable modem may be able to receive eight downstream channels, but the CCAP Core might be able to transmit on 24 or 32 downstream channels. Because of this, the CCAP Core may arrange the number of downstream channels it supports into groups and subsequently deliver a group of downstream channels to cable modems based on some arrangement.

To illustrate, the CCAP Core may divide a set of 24 downstream channels into three groups of eight channels, four groups of six channels, or six groups of four channels, for example. The CCAP Core may then deliver three groups of eight downstream channels to three different sets of cable modems capable of receiving eight downstream channels. Alternately, the CCAP Core may arrange those 24 downstream channels into six groups of four downstream channels; a cable modem capable of receiving eight downstream channels could receive, from the CCAP Core, four downstream channels that are shared with another set of cable modems and four downstream channels that are not shared with another set of cable modems. Thus, the CCAP Core may perform load balancing of a kind by adjusting how downstream channels are organized into groups and how those groups of downstream channels are delivered downstream to cable modems.

CableLabs has also issued a technical report about the R-MACPHY architecture and is currently undertaking an effort to formalize a specification for R-MACPHY products, specifically a Remote MACPHY Device (RMD) which resides in a Remote MACPHY node (RMN). This technical report describes Remote MACPHY (or MAC-PHY) as a generic term given to the distributed CMTS/CCAP architecture where the DOCSIS MAC and PHY layer processing of a CMTS are moved from the headend down to a Fiber Node location.

BRIEF DESCRIPTION OF THE DRAWINGS

Embodiments of the invention are illustrated by way of example, and not by way of limitation, in the figures of the accompanying drawings and in which like reference numerals refer to similar elements and in which.

DETAILED DESCRIPTION OF THE INVENTION

Approaches for dynamically adjusting upstream and/or downstream spectrum usage by a node providing service to a plurality of cable modems are presented herein. Non-limiting examples of such a node include a Remote PHY node (RPN) and a Remote MACPHY node (RMN). In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form or discussed at a high level in order to avoid unnecessarily obscuring teachings of embodiments of the invention.

The principles of operation of embodiments will chiefly be described with reference to a Remote PHY node, but those principles are equally applicable in other contexts, such as a Remote MACPHY node. For example, the operations described below which are carried out in the CCAP Core attached to a Remote PHY node may also be performed in the processing unit included in a Remote MACPHY device comprising a Remote MACPHY node.

Functional Overview

Figure 1:
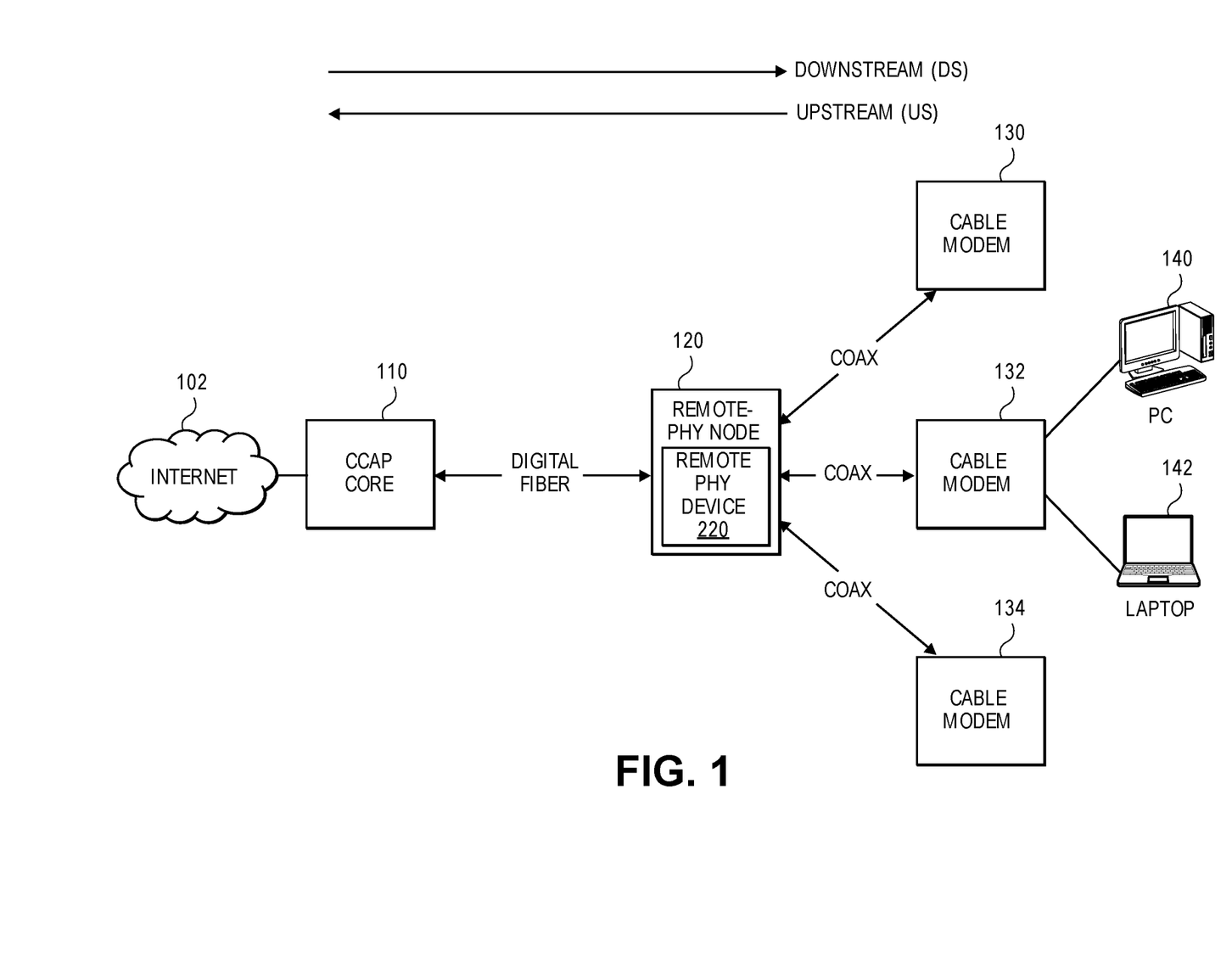
FIG. 1 is a block diagram of a CCAP platform which includes a Remote PHY node (RPN) in accordance with an embodiment of the invention.

FIG. 1 depicts a downstream (DS) direction (i.e., CCAP Core 110 to cable subscribers' network devices) and an upstream (US) direction (i.e., cable subscribers' network devices to CCAP Core 110). Embodiments of the invention enable the spectrum in the upstream (US) direction and/or downstream (DS) direction to be more efficiently utilized which enables new capabilities in a CCAP platform, such as load balancing the upstream and/or downstream spectrum.

In a CCAP system, a Remote PHY device may support a different number of upstream service groups, each service group typically implemented by a different physical upstream port in the Remote PHY device, than downstream service groups and ports. For example, a Remote PHY device in a Remote PHY node commonly supports one downstream service group (one downstream port) and two upstream service groups (two upstream ports). The reason for this is that there is much less available spectrum in the CCAP platform in the upstream direction relative to the downstream direction. As a result, there is much less capacity for data to be sent in an upstream direction.

To help address the reduced capacity inherent in the upstream direction, the number of Remote PHY device upstream ports supported by a Remote PHY node can be increased to two, where each upstream port corresponds to half of the available Remote PHY node upstream capacity, but utilizing the complete available upstream spectrum. Having two upstream ports mitigates the impact to cable modem users serviced by the Remote PHY node when a cable modem is consuming a large amount of upstream bandwidth, as only those cable modems using the same upstream port will be adversely affected. In other cases, the Remote PHY device in a Remote PHY node may support two downstream ports as well as two upstream ports, doubling the potential data throughput capacity in both the upstream and downstream directions. Having two downstream ports mitigates the impact to cable modem users serviced by the Remote PHY node when a cable modem is consuming a large amount of downstream bandwidth, as only those cable modems using the same downstream port will be adversely affected.

A Remote PHY node typically comprises a plurality of coaxial ports, very often four ports, each of which is typically connected via coax cable to a number of different buildings, each of which may have one or more cable modems. When a Remote PHY node is installed, the person performing the installation assigns and physically connects, as per the Remote PHY node RF routing capabilities, each of the Remote PHY node ports to a Remote PHY device downstream port and a Remote PHY device upstream port. Accordingly, cable modems serviced by each of the Remote PHY node ports are thus assigned to a particular Remote PHY device upstream port and downstream port. This assignment is typically made with best efforts to evenly distribute cable modems among the available upstream and downstream ports, but with limited information about current or potential future population of cable modems. Any allocation of the cable modems connected through the Remote PHY node ports to Remote PHY device upstream and downstream ports in a CCAP platform is fixed at the time of installation of the Remote PHY node in the present state of the art.

Over the course of time, the specific cable modem population that is serviced by any Remote PHY node will change as cable modems are retired from service or are brought into service. Also, the amount of data provided through these cable modems to subscribers will change as the subscribers' needs change. Unfortunately, the division of how cable modems are distributed across the available Remote PHY device upstream and downstream ports is initially made without any consideration of the future demands of the upstream and downstream spectrum. As the total number of cable modems connected to each Remote PHY port changes over time, the assignment of Remote PHY node ports (and thus the cable modems connected thereto) to Remote PHY device upstream and downstream ports may create a great imbalance in the utilization of the data capacity in the available upstream and downstream ports of the Remote PHY device. Moreover, the upstream and downstream bandwidth demands of each cable modem may change over time as the needs of the customers each cable modem serves change, typically creating a constantly varying imbalance in the relative utilization of the data bandwidth in the available upstream ports and available downstream ports of the Remote PHY device, and thus in the ability of the CCAP system to provide customers with the upstream and downstream bandwidth they requested, resulting in reduced CCAP data capacity efficiency.

Advantageously, embodiments of the invention provide for dynamically adjusting upstream and downstream spectrum usage by a Remote PHY node. This dynamic adjustment may be made remotely from the Remote PHY node, e.g., by a CCAP Core or by a Cable Modem Termination System (CMTS) comprised therein. By dynamically adjusting upstream and downstream spectrum usage by a Remote PHY node, new opportunities for load balancing the upstream and downstream spectrum may be realized. According to an embodiment, cable modem port association information for a Remote PHY node is dynamically determined remotely from across a network. The association information identifies which cable modems, of a set of cable modems serviced by a Remote PHY node, are serviced through and thus associated with each of the Remote PHY node ports of that Remote PHY node. Embodiments may use various approaches for determining such association information, and several will be discussed in detail below.

Thereafter, based on the gathered and determined association information, and based on bandwidth needs statistics of the groups of cable modems, a change in the actual connectivity between the Remote PHY device upstream and/or downstream ports and between the Remote PHY node ports is performed. This change is typically implemented by a remote-controlled RF routing matrix included in the Remote PHY node. One or more Remote PHY node ports may be reassigned to a different Remote PHY device upstream and/or downstream port. This reassignment may be performed to achieve load balancing of upstream and/or downstream traffic, i.e., traffic sent from a plurality of cable modems to the CCAP Core by way of the Remote PHY node. Due to the nature of the DOCSIS protocol, such upstream load balancing can be carried out without any practical interruption to active services, and thus can be typically applied more rapidly, for example, as often as every minute in an aggressive system or several times a day in a mild system. Downstream load balancing may cause short (e.g., in the order of several seconds) interruptions to active services, and thus may be typically applied only in designated time when such interruptions are acceptable, for example, once a day in aggressive system or even once a year in a mild system.

Architecture Overview

FIG. 1 is a block diagram of a CCAP platform which includes a Remote PHY node 120 and a Remote PHY device 220 in accordance with an embodiment of the invention. The CCAP platform shown in FIG. 1 includes CCAP Core 110, Remote PHY node 120, a plurality of cable modems 130, 132, 134, and network devices 140, 142. The CCAP platform shown in FIG. 1 may be implemented by a virtual CCAP platform that executes on hardware components that include a commercial off-the-shelf switch/router and one or more off-the-shelf computing servers. A commercial example of a virtual CCAP is CableOS™ available from Harmonic, Inc. of San Jose, Calif.

CCAP Core 110, as broadly used herein, refers to a CCAP Core as described in the Remote PHY family of specifications, known as the MHAv2 specifications and administrated by CableLabs®. CCAP Core 110 may include or correspond to a Cable Modem Termination System (CMTS) in an embodiment. CCAP Core 110 may communicate over Internet 102 (as shown in FIG. 1) or one or more private networks (not depicted in FIG. 1).

CCAP Core 110 is typically located at a headend and is used to provide high speed data services to network devices. For example, FIG. 1 depicts two network devices 140, 142, each of which exchanges data with cable modem 132, which in turn exchanges data with CCAP Core 110 by way of Remote PHY node 120. As will be readily appreciated, a practical implementation of a CCAP platform will include many different Remote PHY nodes 120, many different cable modems, and many different network devices; however, for simplicity and ease of explanation, the large numbers of those entities are not depicted in FIG. 1.

CCAP Core 110 stores association information that identifies the node-port association of every operational cable modem in the CCAP platform. The term node-port association refers to an association of a particular node port of a Remote PHY node to any particular cable modem serviced by the CCAP system. By storing such node-port association information for each operational cable modem (collectively referred to herein as association information), CCAP Core 110 may calculate the load, both in terms of the number of cable modems, upstream data utilization and downstream data utilization, per node-port association. CCAP Core 110 may use such association information to determine the best possible Remote PHY node-port assignment to Remote PHY device upstream and downstream ports, to perform upstream and downstream load balancing across available upstream and downstream ports of each Remote PHY device.

Remote PHY node 120, with the assistance of a Remote PHY device 220 (described in more detail below) converts downstream DOCSIS data, MPEG video, and out-of-band (OOB) signals from digital to analog and upstream data, video, and OOB signals from analog to digital. A non-limiting, illustrative example of Remote PHY node 120 is the CableOS™ Ripple-1 Remote PHY node, available from Harmonic, Inc. of San Jose, Calif. While only a single Remote PHY node 120 is depicted in FIG. 1, practical implementations will have a large plurality of Remote PHY nodes in communication with CCAP Core 110.

Remote PHY node 120 is designed to be deployed outdoors near the physical locations of cable modems 130, 132, 134. Remote PHY node 120 is composed of an outer housing that is designed to provide a hermetically sealed environment to the interior of Remote PHY node 120 to protect internal components from outdoor environmental factors, such as humidity, water, debris, and changes in pressure. While only three DOCSIS cable modems are depicted in FIG. 1, practical implementations will have varying numbers of cable modems serviced by a particular Remote PHY node 120. For example, it is not uncommon for more than 100 cable modems to be serviced by a single Remote PHY node 120.

Figure 2:
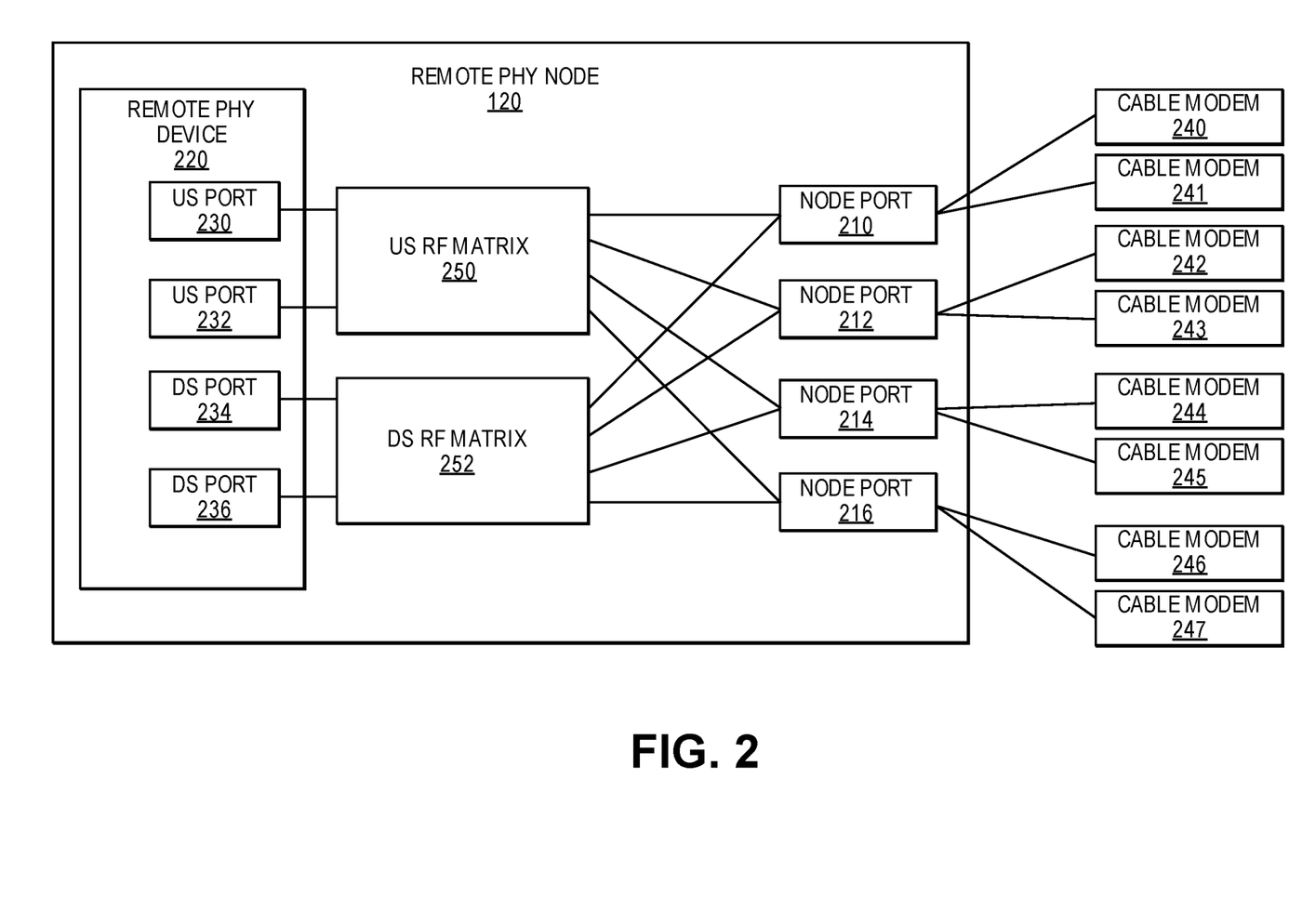
FIG. 2 is a block diagram of a Remote PHY node (RPN) according to an embodiment of the invention.

One such internal component enclosed by Remote PHY node 120 is a Remote PHY device 220. FIG. 2 is a block diagram of a Remote PHY node 120 according to an embodiment of the invention. Remote PHY node 120 may comprise one or more Remote RHY devices 220. Remote RHY device 220 is a computerized device which performs many of the functions involved in converting downstream DOCSIS data, MPEG video, and out-of-band (OOB) signals from digital to analog and upstream data, video, and OOB signals from analog to digital. A non-limiting, illustrative example of Remote RHY device 220 is Harmonic, Inc.'s CableOS™ Pebble-1 Remote PHY device.

FIG. 2 depicts external coaxial ports of Remote PHY node 120 (individually referred to herein as a "node port"), upstream ports of Remote PHY device 220 (individually referred to herein as an "upstream device port") and downstream ports of Remote PHY device 220 (individually referred to herein as a "downstream device port"). As shown in FIG. 2, Remote PHY node 120 comprises four node ports, namely node ports 210, 212, 214, and 216. The number of node ports on Remote PHY node 120 can vary, as FIG. 2 is an illustration of one example. A set of buildings (which each may comprise one or more cable modems) are typically connected to a node port of Remote PHY node 120 via coaxial cable. The number of cable modems that are connected to each node port of Remote PHY node 120 are not necessarily evenly balanced, although that is generally the intent when the Remote PHY node 120 is initially deployed.

Remote PHY device 220 may comprise one or more downstream (DS) device ports, such as downstream device ports 234 and 236, and one or more upstream (US) device ports, such as upstream device ports 230 and 232. In the normal operation of Remote PHY device 220, each node port of Remote PHY node 120 is permanently assigned to a particular upstream device port and a particular downstream device port of Remote PHY device 220. However, according to an embodiment of the invention, an upstream RF matrix 250 may be used to dynamically assign each node port of Remote PHY node 120 to a particular upstream device port of Remote PHY device 220 under remote control supervision, and a downstream RF matrix 252 may be used to dynamically assign each node port of Remote PHY node 120 to a particular downstream device port of Remote PHY device 220 under remote control supervision. In transmitting data in the upstream direction, every cable modem 240 through 247 connected to the Remote PHY node 120 transmits data over a particular Remote PHY node 120 node port to a particular upstream device port of Remote PHY device 220. After receiving the data on a particular upstream device port, Remote PHY device 220 will transmit the data in the upstream direction to CCAP Core 110. In transmitting data in the downstream direction, CCAP Core 110 will transmit the data in the downstream direction to Remote PHY device 220, which will transmit data over a particular downstream device port 234 or 236 of Remote PHY device 220, and through all particular node ports of Remote PHY node 120 connected to that particular downstream device port, to the cable modems connected to those node ports. As the data arrives at all the cable modems connected to these node ports, and as determined by the DOCSIS protocol, some data will be received by just a single cable modem, some data will be received by several of these cable modems, and some data will be received by all of these cable modems.

Dynamically Adjusting Upstream Spectrum Usage

Figure 3:
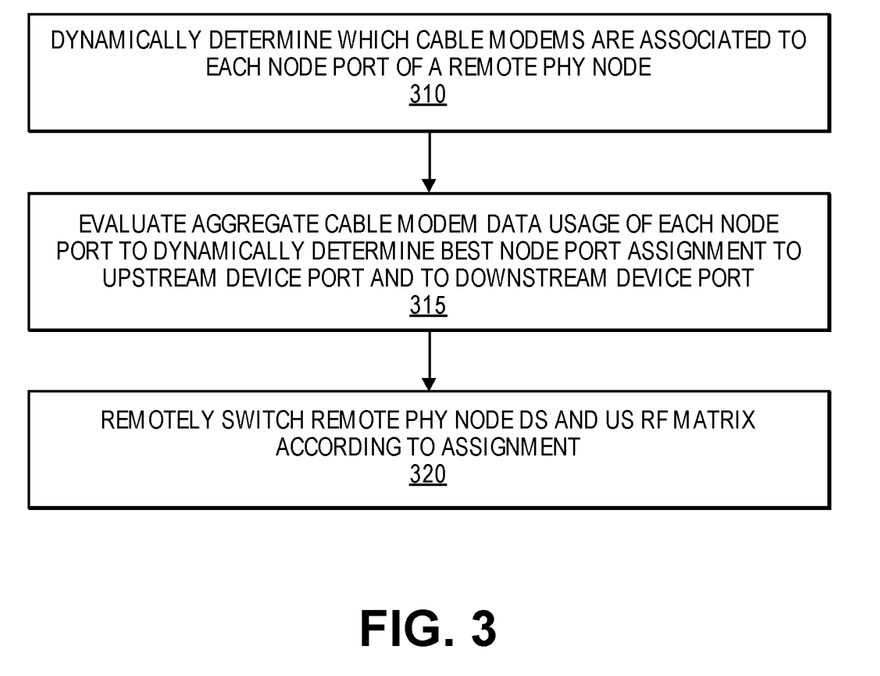
FIG. 3 is a flowchart illustrating the functional steps of dynamically adjusting upstream spectrum usage by a Remote PHY node (RPN) according to an embodiment of the invention.

FIG. 3 is a flowchart illustrating the functional steps of dynamically adjusting upstream and downstream spectrum usage by Remote PHY node 120 according to an embodiment of the invention. The steps of FIG. 3 will be described below with reference to FIG. 2. As shall be discussed in greater detail below, each step of FIG. 3 may be performed by remotely controlling Remote PHY node 120. For example, in an embodiment, each step of FIG. 3 may be performed at CCAP Core 110, e.g., in a Cable Modem Termination System (CMTS) that corresponds to, or is included within, CCAP Core 110.

In step 310, a dynamic determination is made as to which cable modems in the CCAP platform are associated with each node port of Remote PHY node 120. Embodiments may employ different approaches for gathering association information that identifies which cable modems are associated with each node port of Remote PHY node 120. Association information may be used (as described below in step 320) for adjusting how node ports are assigned to upstream device ports and downstream device ports. By adjusting how node ports are assigned to upstream device ports and downstream device ports, CCAP Core 110 performs load balancing on upstream and downstream traffic in the CCAP platform as well as manages the prioritization of upstream and downstream traffic.

Obtaining Association Information

One approach for dynamically determining association information in step 310 involves changing the upstream device port assignment of node ports of Remote PHY node 120. This approach is well suited for use after powering on Remote PHY device 220. After Remote PHY device 220 is powered on, CCAP Core 110 will assign each node port to upstream device port and downstream device port of Remote PHY device 220 using a default assignment algorithm. For example, node ports 210 and 212 may be assigned to upstream device port 230 and to downstream device port 234, and node ports 214 and 216 may be assigned to upstream device port 232 and to downstream device port 236.

After all cable modems connected to Remote PHY node 120 have registered with CCAP Core 110 after Remote PHY device 220 has been powered on, CCAP Core 110 will have some, but not sufficient, information about which node port each cable modem is located on, e.g., cable modems 240 through 243 may be known to be either on node port 210 or 212, and cable modems 244 through 247 may be known to be either on node port 214 or 216. CCAP Core 110 can make a temporary change to the previous node ports to upstream and/or downstream device ports assignment. For example, node ports 210 and 214 may be assigned to upstream device port 230, and node ports 212 and 216 may be assigned to upstream device port 232, without changing node port to downstream device port assignment. After that assignment change, CCAP Core 110 invokes a deliberate communication with each cable modem (such as using the DOCSIS protocol periodic ranging operation or any other command that requires the cable modem to transmit in the upstream direction) and determines the change (if occurred) in the upstream device port at which the data from the cable modem was received. Thereafter, the CCAP Core 110 has sufficient information of all cable modems association to node ports.

Note that when temporarily making the change as in the example above to the node ports to upstream device ports assignment, the cable modems which had their upstream device port assignment changed are not aware of that change. There is no need to invoke the DOCSIS protocol messages that will provide the cable modem with the knowledge of how to properly operate under this new upstream device port assignment since the CCAP Core 110 manages this operation in a special way not described or specified by the DOCSIS protocol. Accordingly, CCAP Core 110 must synchronize the MAPs on the channel(s) used on the different upstream device ports to resolve the location of those cable modems, and reserve the appropriate upstream transmission opportunities given to cable modems on the corresponding channels of both US ports, such that the upstream transmission opportunities given to cable modems will not collide with other opportunities regardless of the US port that each cable modem ends up on during this temporary upstream device port assignment change. After CCAP Core 110 resolves the CM's actual node port, it may need to return the node ports to upstream device ports assignment to the original default assignment. Alternatively, if the CCAP Core 110 determines that a different node port to downstream device port and/or upstream device port assignment is more advantageous, the CCAP Core 110 will use the appropriate DOCSIS protocol messages to officially move the cable modems affected by the assignment changes to the upstream device port and downstream device ports to which the cable modems are actually connected.

Due to the MAP synchronization required by the above scheme, scheduling upstream data traffic when the node port association is unknown is complicated and wasteful of bandwidth capacity. Consequently, dynamically determining association information in step 310 by changing the upstream device ports assignment of the node ports is more appropriate after powering on Remote PHY node 120, as soon as most, or all, of the cable modems serviced by the Remote PHY device 220 have registered, but before actual normal upstream traffic has started.

Another approach for dynamically determining association information in step 310 involves selectively modifying RF gain in the upstream path per node port of Remote PHY node 120. This approach is particularly well suited in determining the node port location of a new cable modem that joins an already established and operational CCAP system (e.g., as would happen when a particular cable modem serviced by Remote PHY device 220 is reset), as this approach has minimal impact on existing upstream traffic of other cable modems.

Figure 4:
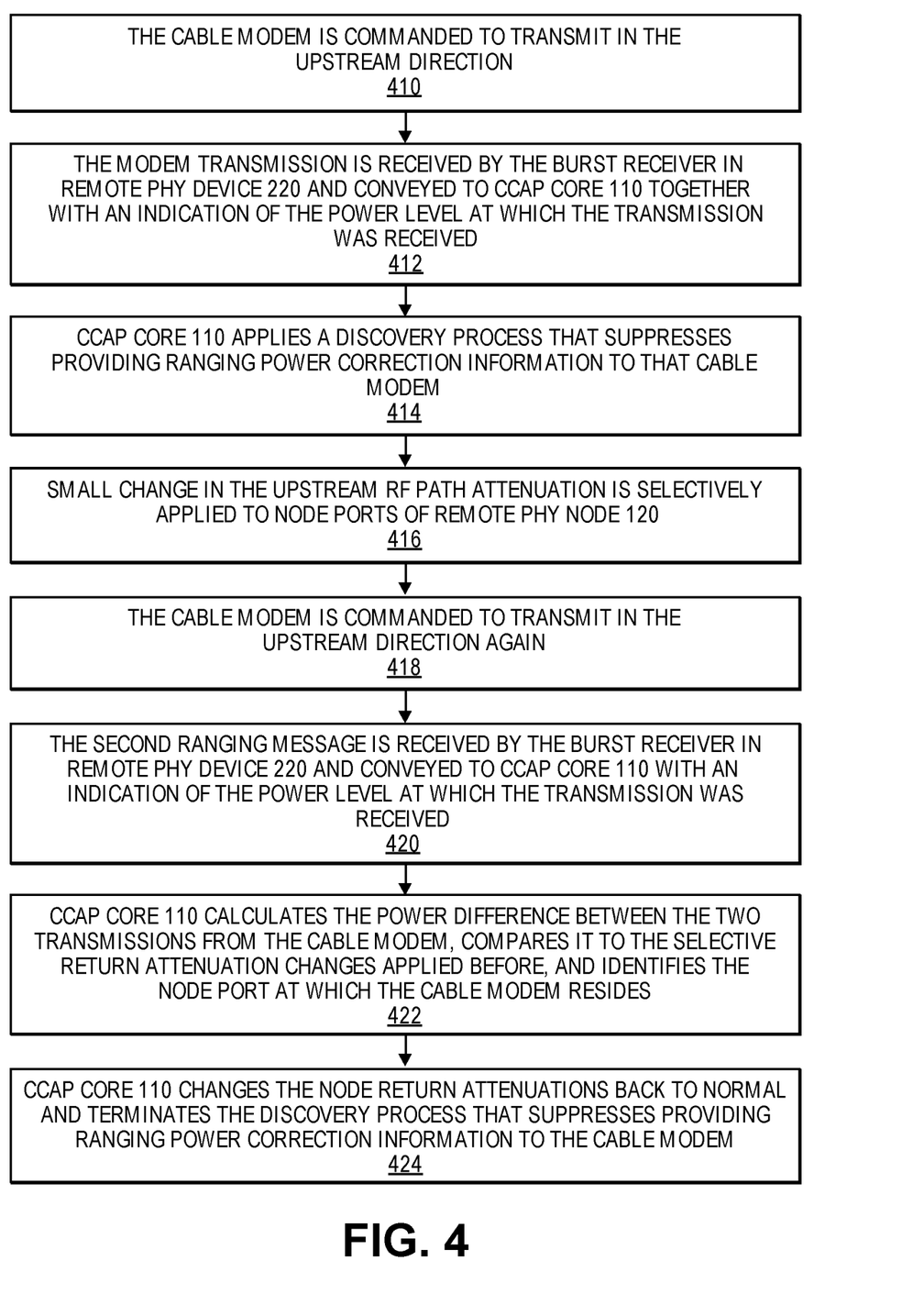
FIG. 4 is a flowchart illustrating an approach for determining association information according to an embodiment of the invention.

In an embodiment, association information may be dynamically determined by selectively modifying the RF gain in the upstream path per node port, and observing the resulting changes in power level for each cable modem. Such an embodiment is depicted in FIG. 4, which is a flowchart illustrating an approach for determining association information according to an embodiment of the invention. In step 410, while the node port is configured for nominal US gain for all return ports, the cable modem is commanded to transmit in the upstream direction, for example, by being given a periodic ranging opportunity on a select upstream channel. In step 412, the modem transmission is received by the burst receiver in Remote PHY device 220 and conveyed to CCAP Core 110 together with an indication of the power level at which the transmission was received, as done with periodic ranging message. In step 414, CCAP Core 110 applies a discovery process that suppresses providing ranging power correction information to that cable modem. In step 416, a small change in the upstream RF path attenuation is selectively made to node ports of Remote PHY node 120. In step 418, the cable modem is commanded again to transmit in the upstream direction, for example, by being given another periodic ranging opportunity, preferably with identical parameters as before, for example, the same channel and same minislot in an Orthogonal frequency-division multiplexing (OFDM) channel. In step 420, the second ranging message is received by the burst receiver in Remote PHY device 220 and conveyed to CCAP Core 110, again, together with an indication of the power level at which the transmission was received. In step 422, CCAP Core 110 calculates the power difference between the two transmissions from the cable modem, compares it to the selective return attenuation changes applied before and identifies the node port at which the cable modem resides. Uncertainty in determination of the node port may require another repetition of steps 416, 418, 420 and 422. In step 424, CCAP Core 110 then changes the node return attenuations back to normal and terminates the discovery process that suppresses providing ranging power correction information to cable modems.

If the current assignment of Remote PHY node 120 employs two node ports connected to (assigned to) the upstream device port of Remote PHY device 220 through which the cable modem is connected to the CCAP Core 110, then a certain attenuation change should be applied (example, +1 dB) to one node port and a different one applied (example, −1 dB) to the other node port.

If the current assignment of Remote PHY node 120 employs three node ports connected to (assigned to) the upstream device port of Remote PHY device 220 through which the cable modem is connected to the CCAP Core 110, then a certain attenuation change should be applied (example, +2 dB) to the first node port, a different one applied (example, 0 dB) to the second node port, and a third one applied (example, −2 dB) to the third node port.

If the current assignment of Remote PHY node 120 employs four node ports connected to (assigned to) the upstream device port of Remote PHY device 220 through which the cable modem is connected to the CCAP Core 110, then certain attenuation changes to the four node ports should be applied with a unique change per node port (example, +3, +1, −1, −3 dB).

If the current assignment of Remote PHY node 120 employs only one node port connected to (assigned to) the upstream device port of Remote PHY device 220 through which the cable modem is connected to the CCAP Core 110, the cable modem's node port is already known, and a repeated upstream transmission from that cable modem is not required.

Reassigning a Node Port to a Different Particular Upstream and/or Downstream Device Port In step 315, the aggregate cable modem data usage of each node port may be evaluated to dynamically determine the best node port assignment to each upstream device port and to each downstream device port. The criteria for determining which node port assignment is deemed "best" may be based on different approaches, as discussed below. For example, a node port assignment may be deemed best or desirable if doing so promotes a load balanced system.

Thereafter, in step 320 of FIG. 3, a particular node port of Remote PHY node 120 is remotely switched from a first device port to a second, different device port. For example, in performing step 320, node port 214 may be reassigned from upstream device port 230 to upstream device port 232. Advantageously, by dynamically switching a particular node port of Remote PHY node 120 to different upstream device port of Remote PHY device 220, a particular node port may be reassigned to different DOCSIS upstream and/or downstream service groups on the fly and in real-time. Using this approach, load balancing may be performed on upstream and downstream traffic sent between cable modems 240 through 247 and CCAP Core 110 by dynamically adjusting to which upstream and downstream device ports of Remote PHY device 220, each node port of Remote PHY node 120 is assigned.

Embodiments may perform such load balancing of upstream and downstream traffic by considering one or more factors or considerations. For example, a measured amount of upstream and downstream traffic sent by each of a set of cable modems to identify the optimal node-port assignment to maximize overall data throughput for all cable modems. This approach is adaptive in that the node-port assignment to device ports of the Remote PHY device 220 may be changed in real-time based on presently occurring upstream and downstream traffic conditions.

Since load balancing of upstream and downstream traffic may be performed in step 320 by CCAP Core 110, and as CCAP Core 110 has visibility into the service plans associated with each cable modem, then embodiments may also perform load balancing of upstream traffic by considering the service plan associated with each of said set of cable modems. In this way, if a cable modem is associated with a service plan that guarantees a certain amount of upstream and/or downstream capacity, that capacity may be monitored, and the node-port associated of that cable modem may be adjusted as needed over time to ensure the requirements of the service plan are satisfied. Alternatively, if the service plans associated with a set of cable modems displays a certain bias indicating a higher concentration of high data rate plan subscribers in any node port, that node port can be given an appropriate priority in assigning the node ports to upstream and/or downstream device ports.

In another embodiment, rather than dynamic and real-time traffic related node port assignment for load balancing, a scheduled and predetermined approach may be used. An example is a Remote PHY node serving a mix of residential and commercial customers. The assignment of node ports to device ports may be guided according to workhour schedule such that the commercial customers get preferential capacity during business open days and hours, whereas residential subscribers get a preferential capacity when businesses are closed.

While embodiments have chiefly been described with respect to a Remote PHY node, other embodiments of the invention may be implemented by a Remote MACPHY node (RMN). Those in the art shall appreciate that in the above teachings, the principles and examples discussed in relation to a Remote PHY node are equally applicable to a Remote MACPHY node.

Implementing Hardware

Figure 5:
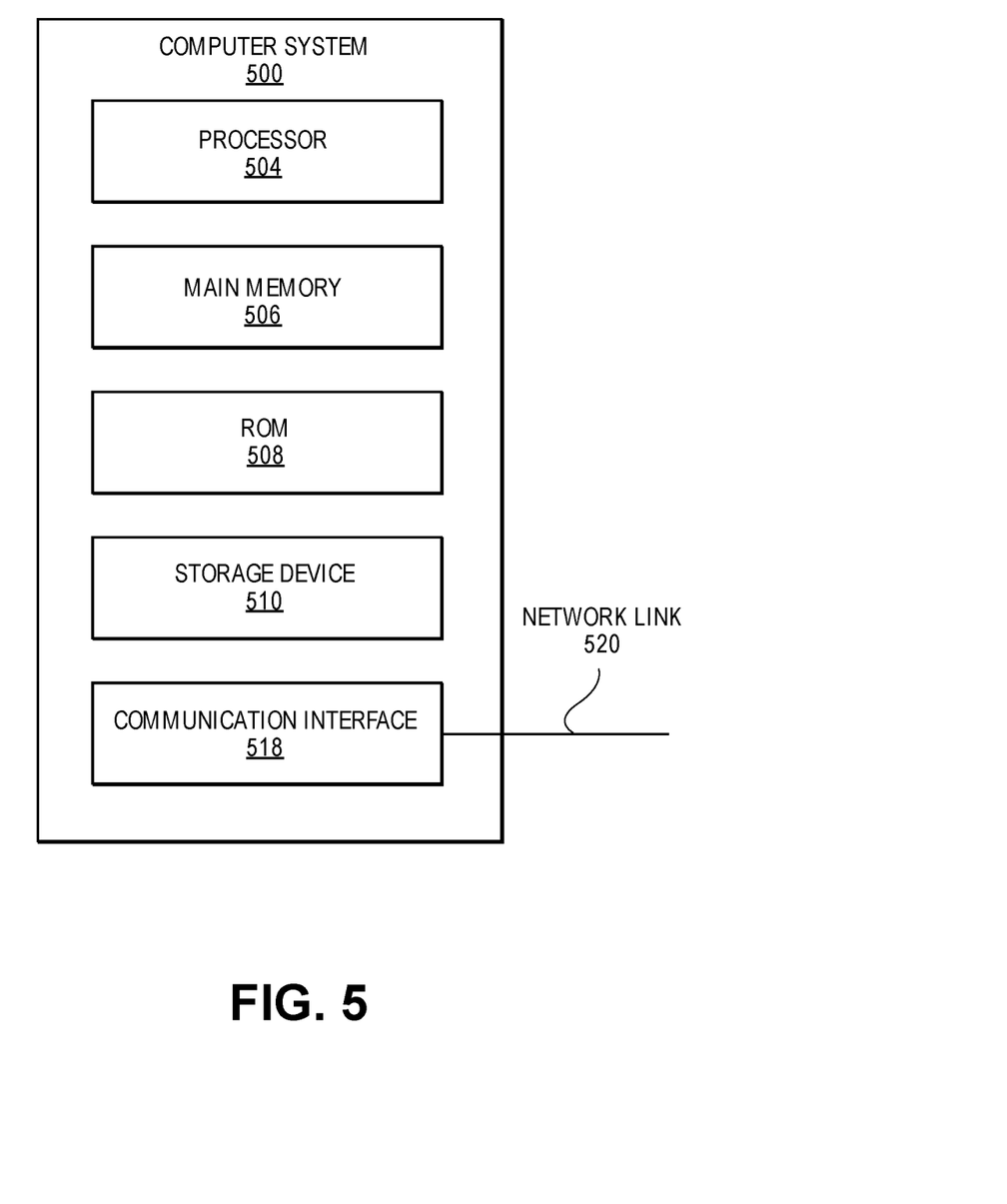
FIG. 5 is a block diagram that illustrates a computer system upon which an embodiment of the invention may be implemented.

In an embodiment, each component depicted in FIG. 1 as well as Remote PHY device 220 may correspond to, or be implemented on, a computer system. FIG. 5 is a block diagram that illustrates a computer system 500, which may be used to implement all or a portion of the functions performed by Remote PHY device 220 or CCAP Core 110 in an embodiment. In an embodiment, computer system 500 includes processor 504, main memory 506, ROM 508, storage device 510, and communication interface 518. Computer system 500 includes at least one processor 504 for processing information. Computer system 500 also includes a main memory 506, such as a random-access memory (RAM) or other dynamic storage device, for storing information and instructions to be executed by processor 504. Main memory 506 also may be used for storing temporary variables or other intermediate information during execution of instructions to be executed by processor 504. Computer system 500 further includes a read only memory (ROM) 508 or other static storage device for storing static information and instructions for processor 504. A storage device 510, such as a magnetic disk or optical disk, is provided for storing information and instructions.

Embodiments of the invention are related to the use of computer system 500 for implementing the techniques described herein. According to one embodiment of the invention, those techniques are performed by computer system 500 in response to processor 504 executing one or more sequences of one or more instructions contained in main memory 506. Such instructions may be read into main memory 506 from another machine-readable medium, such as storage device 510. Execution of the sequences of instructions contained in main memory 506 causes processor 504 to perform the process steps described herein. In alternative embodiments, hard-wired circuitry may be used in place of or in combination with software instructions to implement embodiments of the invention. Thus, embodiments of the invention are not limited to any specific combination of hardware circuitry and software.

The term "non-transitory machine-readable storage medium" as used herein refers to any tangible medium that participates in storing instructions which may be provided to processor 504 for execution. Non-limiting, illustrative examples of non-transitory machine-readable media include, for example, a floppy disk, a flexible disk, hard disk, magnetic tape, or any other magnetic medium, a CD-ROM, any other optical medium, a RAM, a PROM, and EPROM, a FLASH-EPROM, any other memory chip or cartridge, or any other medium from which a computer can read.

Various forms of non-transitory machine-readable media may be involved in carrying one or more sequences of one or more instructions to processor 504 for execution. For example, the instructions may initially be carried on a magnetic disk of a remote computer. The remote computer can load the instructions into its dynamic memory and send the instructions over a network link 520 to computer system 500.

Communication interface 518 provides a two-way data communication coupling to a network link 520 that is connected to a local network. For example, communication interface 518 may be an integrated services digital network (ISDN) card or a modem to provide a data communication connection to a corresponding type of telephone line. As another example, communication interface 518 may be a local area network (LAN) card to provide a data communication connection to a compatible LAN. Wireless links may also be implemented. In any such implementation, communication interface 518 sends and receives electrical, electromagnetic or optical signals that carry digital data streams representing various types of information.

Network link 520 typically provides data communication through one or more networks to other data devices. For example, network link 520 may provide a connection through a local network to a host computer or to data equipment operated by an Internet Service Provider (ISP).

Computer system 500 can send messages and receive data, including program code, through the network(s), network link 520 and communication interface 518. For example, a server might transmit a requested code for an application program through the Internet, a local ISP, a local network, subsequently to communication interface 518. The received code may be executed by processor 504 as it is received, and/or stored in storage device 510, or other non-volatile storage for later execution.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A non-transitory computer-readable storage medium that stores one or more sequences of instructions for dynamically adjusting upstream and downstream spectrum usage by a Remote PHY node, which when executed by one or more processors, cause:
    dynamically determining, remotely across a network, association information that identifies which cable modems, of a set of cable modems serviced by said Remote PHY node, are associated with at least one of (a) each upstream device port of a Remote PHY device comprised within said Remote PHY node, and (b) each downstream device port of said Remote PHY device; and
    remotely, across said network and based on said association information, switching to which node port of said Remote PHY node at least one of (a) a particular upstream device port, and (b) a downstream device port of said Remote PHY device is assigned.

2. The non-transitory computer-readable storage medium of claim 1, wherein said dynamically determining and said remotely switching are both performed at a Cable Modem Termination System (CMTS).

3. The non-transitory computer-readable storage medium of claim 1, wherein execution of the one or more sequence of instructions further cause:
    load balancing, from across said network, at least one of (a) upstream traffic and (b) downstream traffic sent between said set of cable modems and a Cable Modem Termination System (CMTS) by dynamically adjusting to which node port of said Remote PHY node at least one of (a) each upstream device port and (b) each downstream device port of said Remote PHY device is assigned.

4. The non-transitory computer-readable storage medium of claim 3, wherein one or more of load balancing upstream traffic and load balancing downstream traffic is performed, at least in part, by considering one or more factors which include a measured amount of upstream and/or downstream traffic sent by each of said set of cable modems.

5. The non-transitory computer-readable storage medium of claim 3, wherein one or more of load balancing upstream traffic and load balancing downstream traffic is performed, at least in part, by considering a predetermined schedule based upon a current time of day.

6. The non-transitory computer-readable storage medium of claim 3, wherein one or more of load balancing upstream traffic and load balancing downstream traffic comprises dynamically reassigning a DOCSIS upstream and/or downstream service group of said Remote PHY device to a different node port of said Remote PHY node.

7. The non-transitory computer-readable storage medium of claim 3, wherein one or more of load balancing upstream traffic load balancing downstream traffic is performed, at least in part, by considering one or more factors which include a service plan associated with each of said set of cable modems.

8. The non-transitory computer-readable storage medium of claim 1, wherein dynamically determining association information comprises: changing a return segmentation configuration of said Remote PHY device.

9. The non-transitory computer-readable storage medium of claim 1, wherein dynamically determining association information comprises: selectively modifying a return RF gain per upstream device port.

10. A non-transitory computer-readable storage medium that stores one or more sequences of instructions for dynamically adjusting upstream and downstream spectrum usage, which when executed by one or more processors, cause:
dynamically determining association information that identifies which cable modems, of a set of cable modems serviced by a node, are assigned to at least one of (a) each upstream device port of a device comprised within said node, and (b) each downstream device port of said device; and
switching, based on said association information, to which node port of said node at least one of (a) a particular upstream device port, and (b) a downstream device port is assigned,
wherein said node is a Remote PHY Node or a Remote MACPHY node (RMN).

11. An apparatus for dynamically adjusting upstream and downstream spectrum usage by a Remote PHY node, comprising:
one or more processors; and
one or more non-transitory computer-readable storage mediums storing one or more sequences of instructions, which when executed, cause:
dynamically determining, remotely across a network, association information that identifies which cable modems, of a set of cable modems serviced by said Remote PHY node, are associated with at least one of (a) each upstream device port of a Remote PHY device comprised within said Remote PHY node, and (b) each downstream device port of said Remote PHY device; and
remotely, across said network and based on said association information, switching to which node port of said Remote PHY node at least one of (a) a particular upstream device port, and (b) a downstream device port of said Remote PHY device is assigned.

12. The apparatus of claim 11, wherein said dynamically determining and said remotely switching are both performed at a Cable Modem Termination System (CMTS).

13. The apparatus of claim 11, wherein execution of the one or more sequence of instructions further cause:
load balancing, from across said network, at least one of (a) upstream traffic and (b) downstream traffic sent between said set of cable modems and a Cable Modem Termination System (CMTS) by dynamically adjusting to which node port of said Remote PHY node at least one of (a) each upstream device port and (b) each downstream device port of said Remote PHY device is assigned.

14. The apparatus of claim 13, wherein one or more of load balancing upstream traffic and load balancing downstream traffic is performed, at least in part, by considering one or more factors which include a measured amount of upstream and/or downstream traffic sent by each of said set of cable modems.

15. The apparatus of claim 13, wherein one or more of load balancing upstream traffic and load balancing downstream traffic is performed, at least in part, by considering a predetermined schedule based upon a current time of day.

16. The apparatus of claim 13, wherein one or more of load balancing upstream traffic and load balancing downstream traffic comprises dynamically reassigning a DOCSIS upstream and/or downstream service group of said Remote PHY device to a different node port of said Remote PHY node.

17. The apparatus of claim 13, wherein one or more of load balancing upstream traffic load balancing downstream traffic is performed, at least in part, by considering one or more factors which include a service plan associated with each of said set of cable modems.

18. The apparatus of claim 11, wherein dynamically determining association information comprises:
changing a return segmentation configuration of said Remote PHY device.

19. The apparatus of claim 11, wherein dynamically determining association information comprises:
selectively modifying a return RF gain per upstream device port.

20. An apparatus for dynamically adjusting upstream and downstream spectrum usage, comprising:
one or more processors; and
one or more non-transitory computer-readable storage mediums storing one or more sequences of instructions, which when executed, cause:
dynamically determining association information that identifies which cable modems, of a set of cable modems serviced by a node, are assigned to at least one of (a) each upstream device port of a device comprised within said node, and (b) each downstream device port of said device; and
switching, based on said association information, to which node port of said node at least one of (a) a particular upstream device port, and (b) a downstream device port is assigned,
wherein said node is a Remote PHY Node or a Remote MACPHY node (RMN).

21. A method for dynamically adjusting upstream and downstream spectrum usage, comprising:
dynamically determining association information that identifies which cable modems, of a set of cable modems serviced by a node, are assigned to at least one of (a) each upstream device port of a device comprised within said node, and (b) each downstream device port of said device; and switching, based on said association information, to which node port of said node at least one of (a) a particular upstream device port, and (b) a downstream device port is assigned,
wherein said node is a Remote PHY Node or a Remote MACPHY node (RMN).

* * * * *